United States Patent [19]
Gonsalves et al.

[11] Patent Number: 5,927,389
[45] Date of Patent: Jul. 27, 1999

[54] FAN TRAY GUIDE AND ISOLATION MOUNT AND METHOD

[75] Inventors: Daniel D. Gonsalves, Hudson, N.H.; Robert Antonuccio, Burlington, Mass.; William Izzicupo, Windham, N.H.; James Carney, Pepperell, Mass.; Mark Pugliese, Shrewsbury, Mass.; Joseph Spano, North Reading, Mass.; Matthew Palazola, Gloucester, Mass.; David Desilets, Hopkinton, Mass.

[73] Assignee: Sun Microsystems, Inc., Mountain View, Calif.

[21] Appl. No.: 08/880,033

[22] Filed: Jun. 20, 1997

[51] Int. Cl.⁶ .................................................. H05K 7/20
[52] U.S. Cl. ........................ 165/121; 211/26; 361/687; 361/695; 361/801; 361/802; 403/329; 454/184
[58] Field of Search ............................ 165/121, 122; 454/184; 403/329; 211/26, 41.1, 41.17; 312/9.55, 9.56, 9.57; 361/687, 695, 697, 686, 724–727, 797–798, 801, 802

[56] References Cited

U.S. PATENT DOCUMENTS

| | | | |
|---|---|---|---|
| 3,853,379 | 12/1974 | Goodman et al. | 361/801 X |
| 3,899,721 | 8/1975 | Borchard et al. | 361/802 |
| 4,334,261 | 6/1982 | Gonzales | 361/686 |
| 4,356,531 | 10/1982 | Marino et al. | 361/687 X |
| 4,767,262 | 8/1988 | Simon | 361/695 X |
| 4,931,904 | 6/1990 | Yiu | 361/695 |
| 5,079,438 | 1/1992 | Heung | 361/695 X |
| 5,128,830 | 7/1992 | DeLuca et al. | 361/687 X |
| 5,138,526 | 8/1992 | Lin | 361/686 X |
| 5,467,254 | 11/1995 | Brusati et al. | 361/802 X |
| 5,594,627 | 1/1997 | Le | 361/801 |

FOREIGN PATENT DOCUMENTS

| | | | |
|---|---|---|---|
| 82990 | 4/1993 | Japan | 361/802 |
| 645296 | 1/1979 | U.S.S.R. | 361/725 |

Primary Examiner—Leonard Leo
Attorney, Agent, or Firm—Flehr Hohbach Test Albritton & Herbert

[57] ABSTRACT

A computer housing or electronic apparatus frame (10) includes a compartment (12) that provides space for mounting a fan assembly (14) or similar component. The fan assembly (14) is mounted on a fan tray support (16), which is removably mountable within the computer housing (10) by means of the fan tray mounts (18). Fan tray mounts (18) are oriented facing one another so that side rails (22) of fan tray (16) are slidably received by the fan tray mounts (18). The fan tray mounts (18) further includes an elongated guide channel (31) that extends the length of the fan tray mount and is formed in the inside face (30) thereof. The fan tray mounts (18) also include a first, outwardly projecting stop (52) that is positioned inwardly from end wall (38) and a second, outwardly-projecting, resiliently-deflectable stop and latch lever (54) provided adjacent end wall (36). The first stop (52) and the second stop and latch (54) cooperate with tabs (84, 88) on the fan tray (16) to releasably latch the fan tray (16) in a predetermined position along the guide channel (31). The fan tray mounts (18) further include a pair of cantilevered spring arms (60, 62), which bias the fan tray (16) in a direction away from the guide channel (31) to minimize vibration transmission to the computer housing (10).

24 Claims, 5 Drawing Sheets

FAN TRAY GUIDE AND ISOLATION MOUNT AND METHOD

TECHNICAL FIELD

The present invention pertains to mounting assemblies for removably supporting fans and other type of equipment subject to vibration and, more particularly, to such mounting assemblies and methods of removably mounting components in modular computer equipment.

BACKGROUND ART

Computer equipment and related componentry is becoming more modular in design to allow for system design flexibility as well as for easy maintenance and replacement of faulty or damaged parts. Modular flexibility is being designed not only into hardware components, but also into peripheral equipment and devices such as fans, motors, filters etc. The present invention is directed toward achieving modular flexibility and has as an object the goal of providing for easy mounting and removal of a computer fan or similar type of auxiliary equipment within a computer assembly. It is also an object of the present invention to provide an easily removable fan assembly that provides a degree of acoustical and vibration isolation, in order to minimize shock and acoustical vibration travel from the fan assembly to adjacent computer components.

Specifically, prior art computer assemblies typically utilize loose hardware pieces, such as screws and nuts, to secure computer components within a computer housing. Loose hardware pieces make removing and re-installing component pieces more difficult not only due to the tedious nature of manipulating screws, bolts and nuts but also due to the difficulty in properly repositioning and aligning the components upon re-installation. Loose fastening hardware also tends to increase vibration and sound levels of computers as the hardware pieces loosen over time. It is thus another object of the present invention to provide a mount for computer components which minimizes the use of loose fastener hardware and does not require the manipulation of fasteners to remove or reinstall the computer component.

DISCLOSURE OF INVENTION

Briefly described, the present invention comprises a computer component guide and mount for removably mounting a computer component to a computer housing. The computer component guide and mount includes a body formed for securement to the computer housing in a position for support of an edge of a computer component. The is formed with a longitudinally extending channel adapted for sliding engagement with and longitudinal guided movement of the edge of the computer component for mounting and removal of the computer component from an end of the channel. A stop and latch member is provided on the guide and mount body and is adapted to releasably engage or latch the computer component in a fixed longitudinal position along the channel. A resilient biasing element is provided proximate the channel and is adapted to resiliently engage the edge of the computer component and apply a biasing force to the edge in a direction outwardly of the channel to resiliently support the edge of the component while releasably secured in the channel by the stop.

The resilient biasing element is formed to apply a biasing force sufficient to raise the edge of the component away from a base of the channel. This permits a limited but sufficient degree of vibration of the component and minimizes vibration travel from the component to the computer housing. It also eliminates any tolerance stack-up problems that might exist from one side of the computer housing to the other.

Preferably, the resilient biasing element is formed to extend into the guide channel in an unbiased, relaxed condition and is resiliently deflected out of the guide channel as the edge of the component is inserted into the guide channel.

According to an aspect of the invention, the resilient biasing element comprises a cantilevered spring arm. Preferably, a pair of cantilevered spring arms are provided for biasing the component. The cantilevered spring arms deflect inwardly of the guide channel as the edge of the component is mounted onto the guide and mount body.

According to another aspect of the invention, a second guide and mount body is provided that is identical or similar to the first guide and mount body. The second guide and mount body is adapted for sliding engagement with and longitudinal guided movement of the second edge of the component.

The guide and mount bodies, when secured to the computer housing in juxtaposition to each other, are adapted to receive the first and second opposed edges of the computer component, and the resilient biasing elements are aligned to provide opposed biasing forces, to in effect position the computer component in a centered, suspended position between the opposed mounts. The resilient biasing elements provide sufficient play between the edges of the computer component and the guide channel of each guide and mount body to permit slight up and down vibrational movement of the computer component, as well as accommodating tolerance stack-up.

According to another aspect of the invention, the stop assembly includes a first stop adapted to mate with a first tab extending from the edge of the component and thereby stop lateral movement of the component in a first direction along the guide channel, and a movable second stop or latch member adapted to mate with a second tab extending from the edge of the component. When the edge of the component is slid along the channel in the first direction, the second stop is outwardly displaced, allowing lateral movement of the second tab past the second stop until the second stop resiliently snaps back behind and latches against the second tab. Thus, when the component is slid in a second, opposite direction, the second stop prevents return movement of the tray in the second direction.

According to another aspect of the invention, the first and second stops are off-set from one another with respect to the channel, to allow free passage of the first tab of the component edge past the second stop, as the component is slid along the channel.

The present invention also comprises a method of guiding and removably mounting a computer component into a computer housing. The method includes the steps of sliding an edge of the component along a channel formed in a mount body that is secured to the computer housing, releasably latching the computer component with a stop and latch member once the edge of the computer component is moved to a predetermined longitudinal position within the channel, and resiliently engaging the edge of the computer component and applying a biasing force to the edge in a direction outwardly of the channel to resiliently support the edge of the component while latched by the stop and latch member.

These and other features, objects, and advantages of the present invention will become apparent from the following description of the best mode for carrying out the invention, when read in conjunction with the accompanying drawings, and the claims, which are all incorporated herein as part of the disclosure of the invention.

BRIEF DESCRIPTION OF THE DRAWINGS

Throughout the several views, like reference numerals refer to like parts, wherein.

BEST MODE OF CARRYING OUT THE INVENTION

Reference will now be made in detail to the preferred embodiments of the invention, examples of which are illustrated in the accompanying drawings. While the invention will be described in conjunction with the preferred embodiments, it will be understood that the described embodiments are not intended to limit the invention specifically to those embodiments. On the contrary, the invention is intended to cover alternatives, modifications and equivalents, which may be included within the spirit and scope of the invention as defined by the appended claims.

Figure 1:
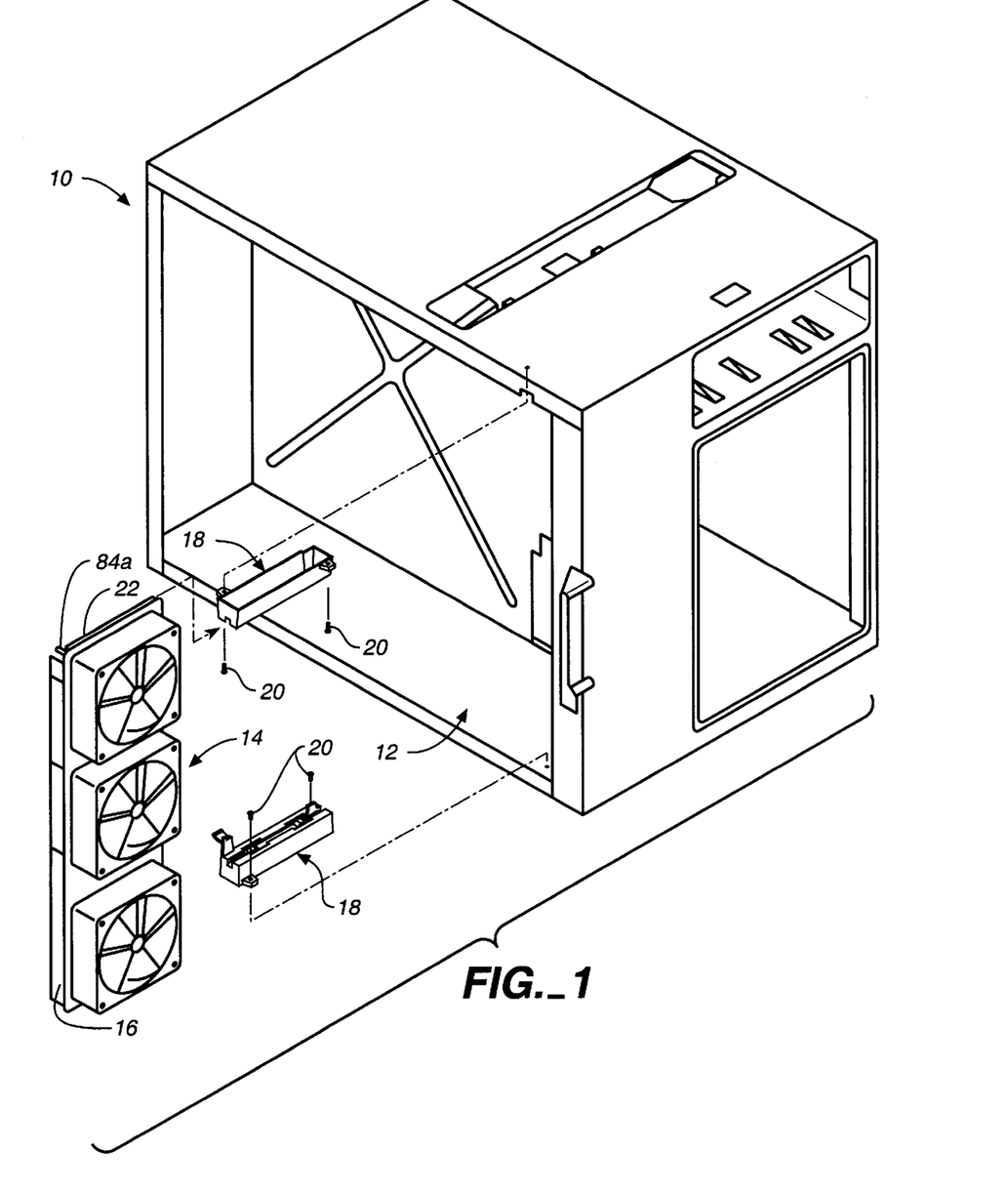
FIG. 1 is an exploded pictorial view of computer housing, fan assembly and a fan tray guide and mount assembly constructed in accordance with the present invention.

Referring to FIG. 1, a large, rectangular, housing frame, generally designated 10, is shown, which for exemplary purposes, may be a housing for an electronic device, such as a computer. Housing 10 is merely an example of the type of enclosure or framework in which the flexible mounts of the present invention may be installed. Computer housing frame 10 includes a front compartment 12 that provides space for mounting a fan assembly 14 as well as other computer components, such as a CPU/Motherboard, which components may or may not requiring fan cooling. Fan assembly 14 is mounted on an upright fan tray support 16, which is removably mountable within front compartment 12 by means of a pair of fan tray mounts 18. Fan tray mounts 18 are each secured within front compartment 12 by means of screws 20 and are oriented facing one another so that side rails 22 (only one shown in FIG. 1) of fan tray 16 are slidably received and supported by fan tray mounts 18 in a manner discussed in more detail with reference to FIGS. 8–10.

The present invention resides in the design of fan tray mounts 18 and their cooperating relationship with the side rails 22 of fan tray 16. The design of computer housing 10, therefore, forms no part of the present invention and, in fact, the fan tray mounts discussed herein can be used to mount fan trays or other types of components within other types of enclosures, housings and compartments. However, the present invention is designed to work particularly well with equipment components that vibrate, such as fans and motors. In addition, fan assembly 14, while shown to include three fans, can include any number of fans or other components and the fans or components can have any design or configuration as space and functionality require.

Figures 2, 4:
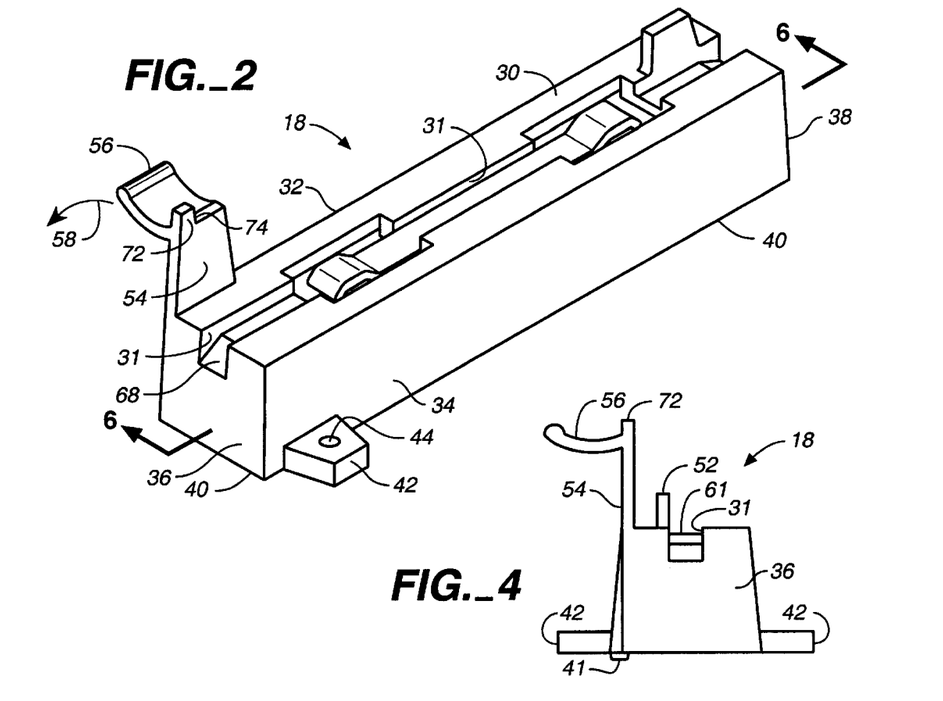
FIG. 2 is an enlarged pictorial view of one of the fan tray mounts of FIG. 1.
FIG. 4 is an end elevation view of the fan tray mount of FIG. 3.
Figure 5:
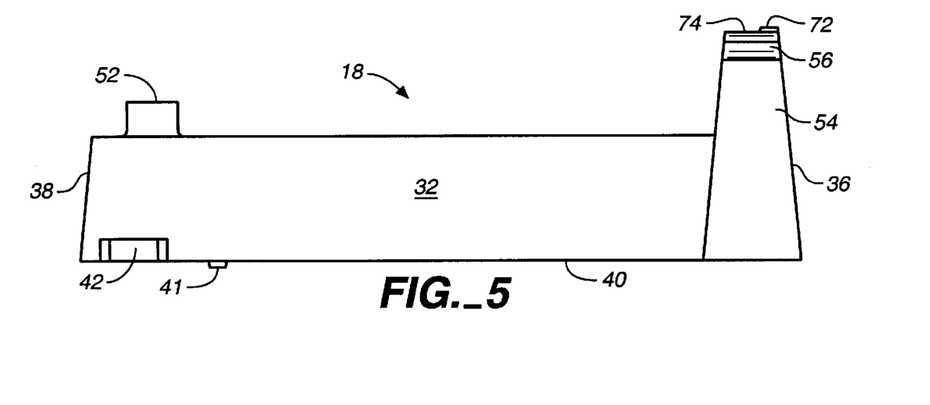
FIG. 5 is a side elevation view of the fan tray mount of FIG. 3.

The pictorial view of fan tray mount 18 of FIG. 2 provides an overview of its important design features. Fan tray mount 18 includes an inside face 30 that includes a guide channel 31 extending along the length of fan tray mount 18. Fan tray mount 18 also includes elongated side walls 32, 34 and short end walls 36, 38, which together form a rectangular base edge 40 at their outer edges opposite inside face 30. Base edge 40 is designed to butt against or engage the inside walls of the computer housing frame and is mounted thereto by means of mounting lugs 42, one on each side of fan tray mount 18 (only one shown in FIG. 2), extending outwardly from base edge 40. Suitable fasteners, such as screws or bolts can be inserted through openings 44 in lugs 42 to secure the mounts to housing 10 in compartment 12. As best can be seen in FIGS. 4, 5 and 16, an indexing tab or protrusion 41 can optionally be provided on base 40 to mate with an opening in compartment 12 or housing 10 so as to locate mount 18 for attachment to the housing with fasteners.

Fan tray mount 18 preferably is injection molded of a resilient, structural plastic material, such as GE Cycloy C2950HF plastic resin, and is formed to have a hollow interior in order to reduce material costs and weight. Of course, other materials and manufacturing techniques known in the art can be employed for producing the fan tray mount.

Fan tray mount 18 also includes a stop assembly with a first, upwardly projecting stop post 52 that preferably is positioned longitudinally inwardly a short distance from end wall 38. Stop 52 cooperates with a corresponding tab 84 on the fan tray to limit longitudinal or translational movement of the fan tray along guide channel 31 in a first, mounting direction 99 (FIG. 9). This is discussed in more detail with reference to FIGS. 8 and 9. A second, upwardly projecting deflectable stop and latch lever 54 is provided adjacent opposite mount end wall 36. Stop and latch lever 54 includes a short manually engageable segment 56 for grasping and deflecting lever 54 in the direction shown by arrow 58. Stop lever 54 also includes a raised ear 72 that provides a stop shoulder 74 on top of stop lever 54. Like first stop 52, shoulder 74 of stop and latch lever 54 cooperates with a corresponding tab 92 on the fan tray to limit longitudinal or translational movement of the fan tray along guide channel 31 in a second, removal direction. 100. This is also discussed in more detail with reference to FIGS. 8 and 9.

Figure 3:
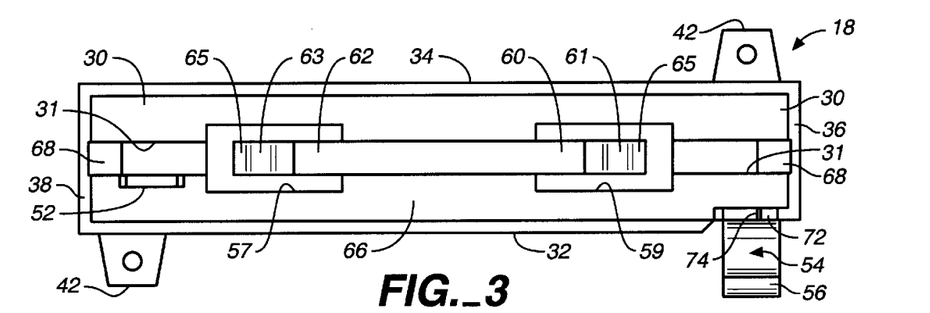
FIG. 3 is a reduced-size top plan view of the fan tray mount of FIG. 2.
Figure 6:
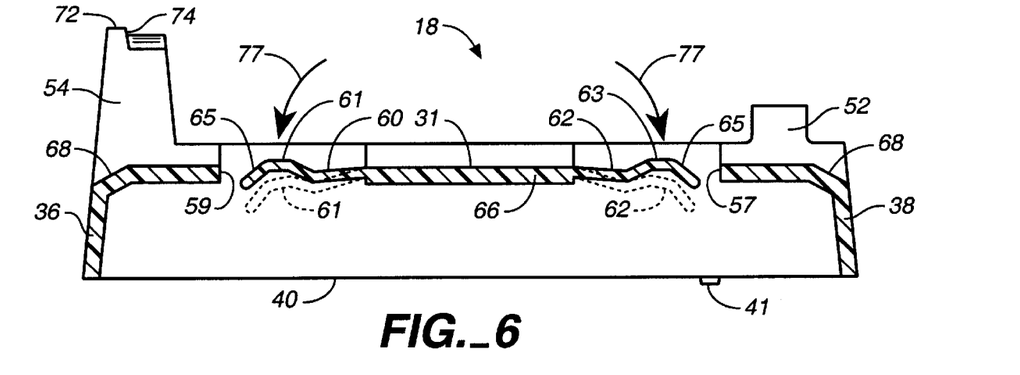
FIG. 6 is a section al view, taken along the line 6—6 of FIG. 2, showing the cantilevered spring arms.

Referring to FIGS. 3 and 6, fan tray mount 18 is shown to further include a pair of rectangular openings 57, 59, which are formed in inside face 30 and open out the back side of the fan tray mount. At least one, but preferably a pair of cantilevered spring arms 60, 62 are each monolithically formed with a center region or bridge section 66 of the body of the mount at a position that is between rectangular openings 57, 59. Spring arm 60 includes a raised outer end 61 and spring arm 62 includes a similar raised outer end 63. Each raised end 61, 63 includes a downwardly sloped leading outer edge 65. It can also be seen that channel 31 includes sloped leading edge sections 68 at either end to act as a lead-in for mounting the fan in mounts 18.

It can be seen in FIG. 3 that first stop 52 is positioned closely laterally adjacent guide channel 31, while second stop lever 54 is laterally spaced from guide channel 31 a distance slightly greater than first stop 52. This allows passage of first tab 84 of the fan tray past stop lever 54, as the fan tray is slidingly mounted onto the fan tray mount. This also is discussed in more detail with reference to FIGS. 8 and 9.

Raised end 61 of spring arm 60 is raised enough to partially extend up into guide channel 31 when the spring arm is in a relaxed position, as best may be seen in FIG. 6. The other spring arm end 63 is similarly raised. Each spring arm has sufficiently flexibility to be displaced downwardly out of guide channel 31 when the side rail of the fan tray is mounted onto the fan tray mount. Accordingly, raised ends 61, 63 of spring arms 60, 62 can be seen to protrude up into channel 31, but are deflected downwardly, in the direction of arrows 77, and to the positions as shown in phantom, when the side rail of the fan tray is mounted onto fan tray mount 18.

Figure 7:
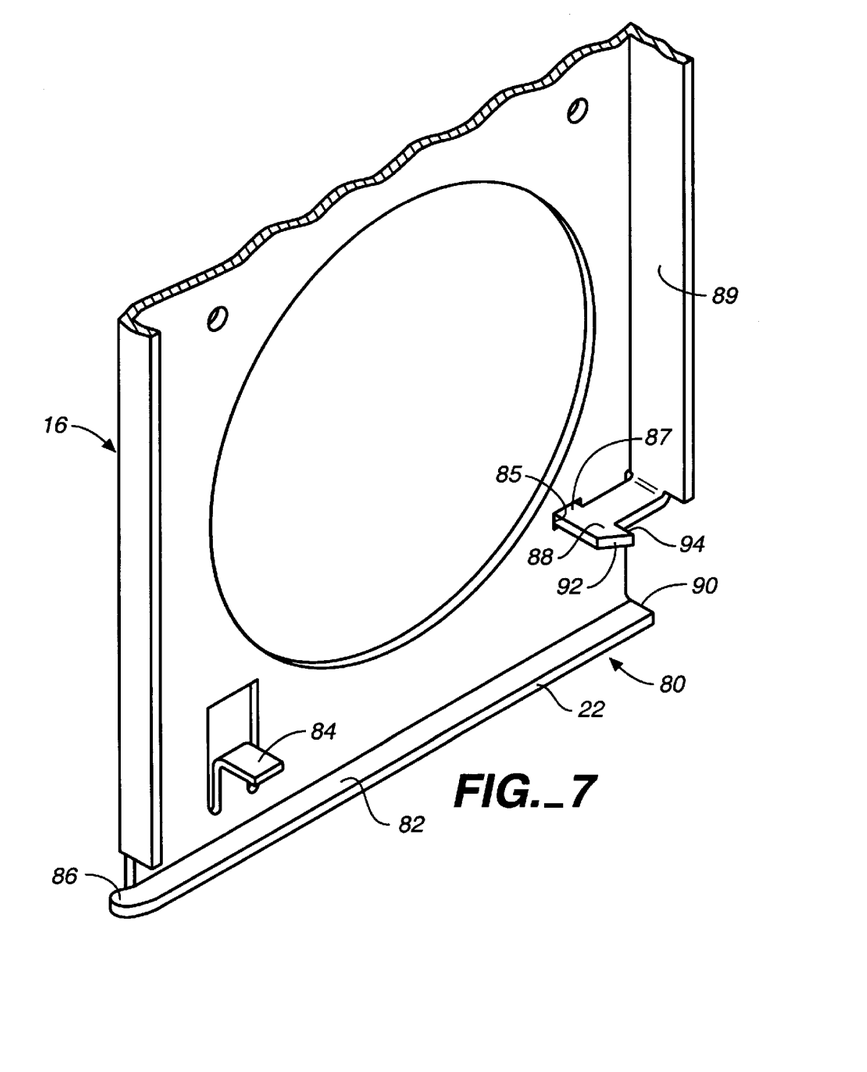
FIG. 7 is a pictorial view of a side rail section of the fan tray of FIG. 1.

Referring to FIG. 7, a lower end or side section 80 of fan tray 16 includes an end or side rail 22. The upper end or side can be seen from FIG. 1 to be similarly formed. Side rail 22 is formed by an in turned lip 82 preferably extending transversely along the entire length of end or side 80. The width of side rail 22 is slightly narrower than the width of guide channel 31, to allow easy longitudinal or translational sliding movement of the side rail within the guide channel. A first tab 84 is punched out of section 80 and bent to extend transversely from fan tray 16 at a location spaced from a first upturned end 86 of side rail 22. Other tab or stop constructions would be suitable for use in the present invention. Since first stop 52 of the fan tray mount is immediately adjacent guide channel 31, first tab 84 only need extend outwardly a short distance sufficient to allow it to engage first stop 52 of the fan tray mount.

A second tab 88 may be punched out or otherwise formed from a side flange 89 of fan tray 16 and is spaced inwardly from a second end 90 of side rail 22. Second tab 88 includes an outwardly protruding ramp 92. Ramp 92 leads to a transverse stop shoulder 94 on second tab 88. Ramp 92 and shoulder 94 cooperate with second stop and latch lever 54 of the fan tray mount to secure fan tray 16 onto the fan tray mount in a longitudinally predetermined position, as discussed with reference to FIGS. 8 and 9. A projection 87 on tab 88 can be provided to locate the vertical position of tab 88 by being inserted into an opening 85 in the front of the fan tray. This eliminates the need to weld or otherwise fasten tab 88 to secure it in a vertical position for engagement of stop and latch lever 54. As will be appreciated, however, other constructions of latching tab 88 are also possible.

Figure 8:
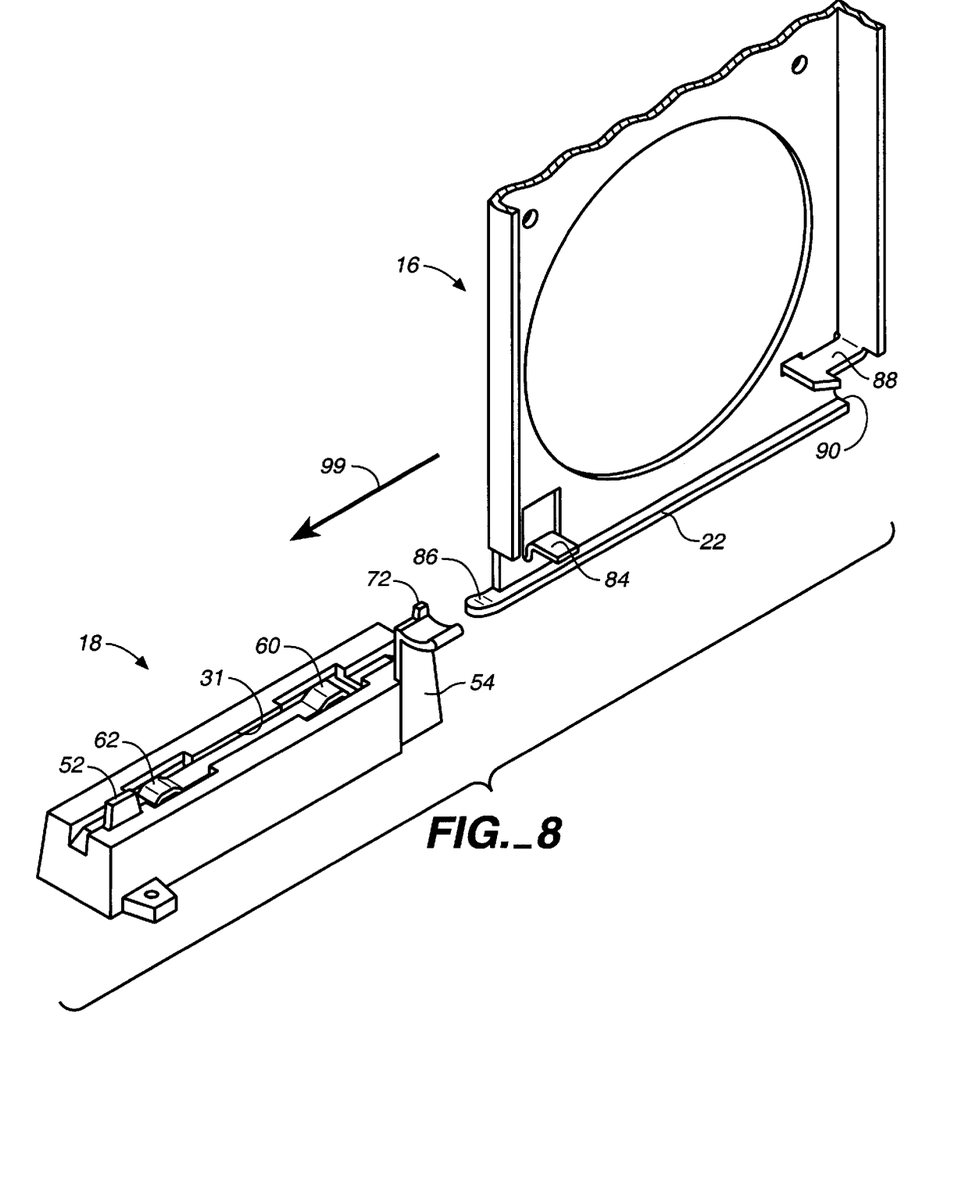
FIGS. 8 and 9 are pictorial views showing the fan tray side rail section of FIG. 7 being mounted onto the fan tray mount of FIG. 2.
Figure 9:
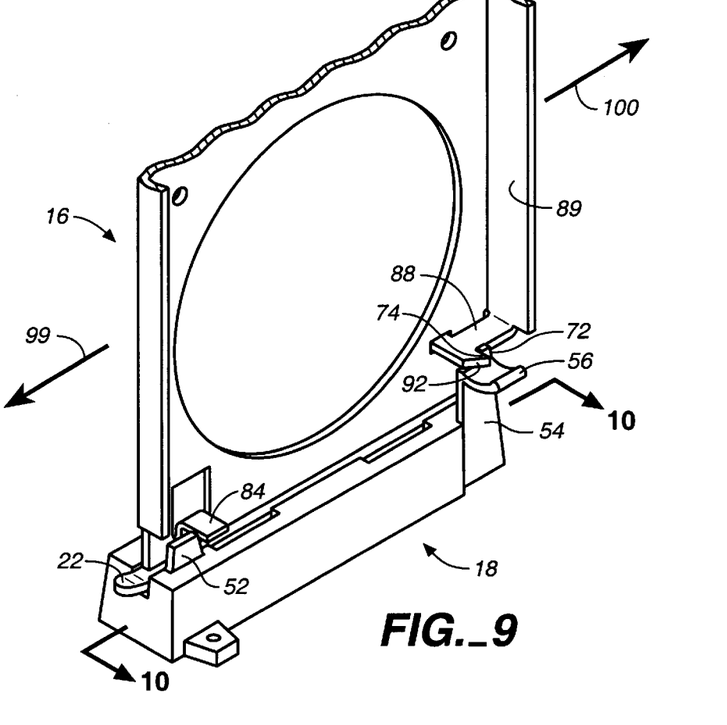

Referring to FIGS. 8 and 9, to mount fan tray 16 onto fan tray mount 18, side rail 22 is aligned with guide channel 31, with upturned first end 86 leading second end 90. Fan tray 16 is then slid in a translational movement, as indicated by arrow 99, along guide channel 31. First tab 84 moves past stop lever 54 due to the fact that stop lever 54 is spaced outwardly of guide channel 31, allowing first tab 84 to pass inwardly of stop lever 54. Side rail 22, lead-in 86 engages and partially depresses sloped surface 65 on raised end 61 of spring 60 and then engages and partially depresses raised end 63 of spring arm 62. This creates upward biasing forces that biases fan tray 16 out of guide channel 31.

As shown in FIG. 9, when fully mounted on fan tray mount 18, the first tab 84 of fan tray 16 engages first stop post 52, which prevents any further longitudinal advancement of fan tray 16 along guide channel 31. Also, just prior to first tab 84 engaging stop post 52, ramp 92 engages ear 72, which causes stop and latch lever 54 to deflect outwardly a distance sufficient to permit ramp 92 to move past ear 72. When ramp 92 moves fully past bump 72, stop lever 54 resiliently snaps inwardly or latches, so that shoulder 74 engages stop shoulder 94 at the end of ramp 92, thus interlocking stop and latch lever 54 with second tab 88.

In the fully mounted position of FIG. 9, stop post 52 prevents longitudinal movement of fan tray 16 in a first mounting direction corresponding to arrow 99 and ear 72 of stop and latch lever 54 prevents movement of fan tray 16 in a second removal direction opposite to that of arrow 99, as shown by arrow 100. To remove fan tray 16, the handle 56 of stop lever 54 is grasped and deflected outwardly, which allows ramp 92 to move longitudinally past ear 72 in the direction of arrow 100.

Figure 10:
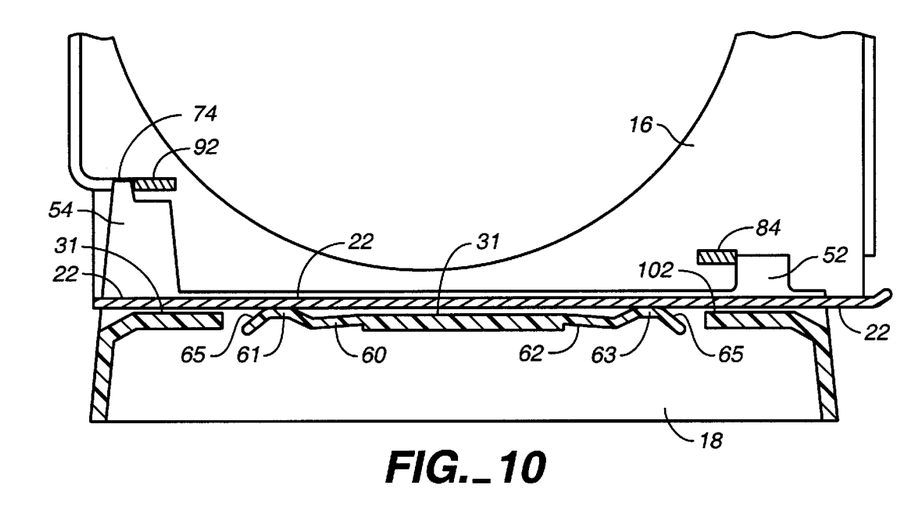
FIG. 10 is a sectional view taken along the line 10—10 of FIG. 9 showing the cantilevered spring arms applying a biasing force to the side rail of the fan tray.

Referring to FIG. 10, fan tray 16 is shown fully mounted onto fan tray mount 18. Side rail 22 is within guide channel 31 supported by spring arms 60, 62. Depending on the arrangement supporting an opposite edge or other part of fan tray 16, spring arms 60, 62 bias side rail 22 outwardly of guide channel 31 a small distance, as indicated by reference numeral 102, to space side rail 22 from the base of the guide channel. The use of two biasing spring arms 60, 62 provides additional biasing force, as well as redundancy in the event that one spring should break. Preferably, the opposite end or side of fan tray 16 includes a side rail similar to side rail 22, which is the design of fan tray 16 as shown in FIG. 1. When a second fan tray mount 18 supports the opposite side rail of the fan tray, opposing biasing forces are placed on the fan tray, which spaces the fan tray from the computer housing at both ends or sides of the fan tray.

Spacing of the fan tray from the computer housing has the advantage of isolating both acoustical and shock vibrations caused by the fan assembly. As a result, the computer assembly is quieter overall, and fan vibration is less likely to affect operation of the other computer components.

Provision of spring arms to space the fan tray from the fan tray mounts also has the advantage of allowing for greater tolerances and tolerance stack-up for the component part being mounted within the computer housing. For example, fan trays of slightly different sizes can be accommodated by a single pair of fan tray mounts.

While fasteners are preferably used to secure mounts 18 to compartment 12, these fasteners do not have to be undone or released to remove the fan tray or refastened to remount the fan tray. Instead, the fan tray mounts 18 are secured to compartment 12 by fasteners only once, and thereafter the fan tray is latched in and unlatched from the mounts 18 by resiliently displaceable stop and latch lever 54.

In the broadest aspect of the present invention, it is only necessary that one fan tray mount be used, but it is most preferable that a pair of mounts 18 be provided to engage opposite sides or ends of the component to be resiliently mounted to the computer housing. Similarly, in the broadest aspect, when two mounts 18 are used, only one needs to latch the component. The other fan tray mount need only have a recessed channel and a spring mechanism, although the most preferred approach is to have the upper and lower mounts 18 be identical and simply eliminate latching tab 88 from either the upper or lower side of the computer component. Thus, the fan tray is slid between the fan tray mounts, as discussed herein, but only one latch mechanism, formed to releasably prevent removal would be provided either on the top or bottom fan tray mount. This latch would engage the fan tray and hold the fan tray in position on the fan tray mounts.

When identical mounts 18 are employed, the second fan tray mount can be rotated end-to-end to have its first stop post 52 and second stop lever 54 in reversed positions at the opposite or upper end of the fan tray. When this approach is used, the upper side rail can be formed with a tab 84a (FIG. 1), which engages post 52 and the tapered latching tab 88 is eliminated. The fan tray assembly, therefore, is latched in channels 31 solely by the lower mount, which latches against shoulder 74 and prevents removal from the mounts.

A second option is to form the second fan tray mount in a reverse or mirror image of the first. With this embodiment, the second stop and latch levers 54 of both fan tray mounts are proximate the outside of the housing compartment and the first stop posts 52 are inwardly thereof. Also, latch tabs 88 on each side rail of the fan tray are each at the front or insert edge of the fan tray and first tabs 84, 84 are each at the back edge. When mounting the fan tray, both first tabs 84, 84a move past the second stop levers 54 of each fan tray mount before engaging first stop posts 52. This configuration would allow latch at both the top and bottom edges of the fan tray with both second stop levers 54 being positioned outwardly of the compartment 12, making it easy to release two stop levers and remove the fan tray. In most applications, however, a single latch 54 is all that is required. Thus, the cost of having a mirror image mold need not be incurred.

The fan tray mounts each act as a guide and mount body for supporting an edge of a computer component, such as a fan tray assembly. The fan tray mounts guide the edge of the fan tray as the fan tray is mounted within the computer housing and the fan tray mounts provide latched or indexed positioning and support for the fan tray once it is mounted positioned in the computer housing. The spring arms act as resilient biasing elements and can be positioned or provided anywhere proximate the guide channel that will allow them to resiliently engage an edge of a computer component and bias the component in a direction outwardly of the guide channel.

Having described the apparatus of the present invention, the method of guiding and removably mounting a computer component in a computer housing can be set forth. The present method includes the step of sliding an edge 22 of a computer component, such as a fan tray 16, along a channel 31 formed in a mount 18 secured to computer housing 10. Next, the computer component is releasably latched by a stop/latch member 54 when the edge of the computer component is at a predetermined position sufficiently within channel 31 to support the component in the computer housing. Finally, the present method includes the step of resiliently engaging edge 22 of the computer component and applying a biasing force, for example through spring arms 60 and 62, to edge 22 in a direction outwardly of channel 31 to resiliently support the component in channel 31 while in a latched condition.

In the most preferred form of the present method, the sliding step is accomplished by sliding opposed edges 22 along opposed channels 31 of opposed mounts 18, and the method includes the step of applying opposing biasing forces to the component opposed edges to resiliently suspend or support the computer component between two mounts 18 out of engagement with guide channels 31.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto when read and interpreted according to accepted legal principles such as the doctrine of equivalents and reversal of parts.

What is claimed is:

1. A computer component guide and mount for removably mounting a computer component to a computer housing comprising:

a guide and mount body formed for securement to the computer housing in a position for support of an edge of a computer component, the guide and mount body being formed with a longitudinally extending channel adapted for sliding engagement with a longitudinal guided movement of the edge of the computer component for mounting and removal of the computer component from an end of the channel, a stop and latch member provided on the guide and mount body adapted to releasably latch the computer component in a fixed longitudinal position along the channel, a resilient biasing element provided proximate the channel and adapted to resiliently engage the edge of the computer component and apply a biasing force to the edge in a direction outwardly of the channel to resiliently support the edge of the component while releasably latched in the channel, and the guide and mount body includes a first stop adapted to mate with a first tab extending from the edge of the component and thereby stop longitudinal movement of the component in a first direction along the guide channel, and the stop and latch member is resiliently displaceable and adapted to mate with a second tab extending from the edge of the component in a manner wherein, when the edge of the component is slid along the channel in the first direction, the stop latch member is outwardly displaced allowing longitudinal movement of the second tab past the stop and latch member, and when the component is slid in a second, opposite direction, the stop and latch member prevents longitudinal movement of the tray in a second direction along the guide channel.

2. The apparatus of claim 1 wherein,
the resilient biasing element is formed to apply a biasing force sufficient to raise the edge of the component out of engagement with a base of the channel.

3. The apparatus of claim 1 wherein,
the resilient biasing element is formed to apply a biasing force sufficient to minimize vibration travel from the component to the computer housing.

4. The apparatus of claim 1 wherein,
the resilient biasing element is formed to extend into the guide channel is an unbiased, relaxed condition and resiliently deflect out of the guide channel as the edge of the component is inserted into the guide channel.

5. The apparatus of claim 1 wherein,
the resilient biasing element comprises a cantilevered spring arm.

6. The apparatus of claim 5 wherein,
the resilient biasing element comprises a pair of cantilevered spring arms.

7. The apparatus of claim 1 and further comprising a second guide and mount body similar to the first guide and mount body, the computer component including a second edge, the second guide and mount body adapted for sliding engagement with and longitudinal guided movement of the second edge of the component.

8. The apparatus of claim 7 wherein, the guide and mount bodies, when secured to the computer housing in juxtaposition to each other, are adapted to receive the first and second edges of the computer component, and the resilient biasing elements are aligned to provide opposed biasing forces suspending the computer component in a centered position between the guide and mount bodies.

9. The apparatus of claim 8 wherein, the resilient biasing elements provide sufficient play between the edges of the computer component and the guide channel of each guide and mount body to permit slight up and down movement of the computer component.

10. The apparatus of claim 1 wherein, the stop and latch member is a resiliently flexible lever.

11. The apparatus of claim 1 wherein, the first stop and the stop and latch member are off-set from one another with respect to the channel, to allow passage of the first tab of the component edge past the stop and latch member, as the component is mounted in the channel.

12. The apparatus of claim 1 wherein, the computer component is a fan.

13. A computer component guide and isolation mount assembly for removably supporting and mounting a computer component within a computer housing, comprising a computer component having first and second opposed side edges, and first and second tabs extending from proximate the first side edge, and first and second computer component mounts for securement within the computer housing in position to mate with and support the opposed side edges of the computer component when the computer component is mounted within the housing, each computer component mount including a longitudinal channel adapted to slidably receive a side edge of the computer component as the computer component is slid longitudinally in a direction parallel to its side edges between the computer component mounts, one of the computer component mounts including a first stop adapted to mate with the first tab extending from the first side edge of the component and thereby stop longitudinal movement of the component in a first direction, and a movable second stop and latch member adapted to mate with the second tab extending from the first side edge of the component in a manner wherein, when the computer component is slid between the computer component mounts in the first direction, the second stop and latch member is displaced allowing longitudinal movement of the second tab past the second stop and latch member, and when the computer component is slid in a second, opposite direction, the second stop and latch member prevents longitudinal movement of the component, one of the computer component mounts including a biasing element for biasing a side edge of the computer component so that the computer component is held between the first and second computer component mounts in a manner permitting slight up and down movement of the computer component, in order to diminish vibration travel from the computer component to the computer housing.

14. The assembly of claim 13 wherein, both of the computer component mounts include a first stop adapted to mate with a first tab extending from each side edge of the component and thereby stop longitudinal movement of the component in a first direction.

15. The assembly of claim 13 wherein, the second tab includes a ramp formed to engage and outwardly displace the second stop and latch member, and the second stop and latch member includes a manually engageable segment permitting outward displacement of the second stop and latch member to unlatch the computer component.

16. The assembly of claim 13 wherein, the resilient biasing element is formed to apply a biasing force sufficient to raise the edge of the component out of engagement with a base of the channel.

17. The assembly of claim 13 wherein, the resilient biasing element is formed to apply a biasing force sufficient to permit vibration of the component and minimize vibration travel from the component to the computer housing.

18. The assembly of claim 13 wherein, the resilient biasing element is formed to extend into the guide channel is an unbiased, relaxed condition and resiliently deflect out of the guide channel as the edge of the component is inserted into the guide channel.

19. The assembly of claim 18 wherein, the resilient biasing element comprises a cantilevered spring arm.

20. The assembly of claim 19 wherein, the resilient biasing element comprises a pair of cantilevered spring arms.

21. The assembly of claim 13 wherein, each computer component mount includes a biasing element, so that the component is biased between the computer component mounts.

22. The assembly of claim 13 wherein, the computer component is a fan.

23. A method of guiding and removably mounting a computer component to a computer housing, the computer component including a side edge, comprising sliding the edge of the component along a guide channel formed in a mount body that is secured to the computer housing, releasably latching the computer component by a stop mechanism carried by the mount body once the edge of the computer component is sufficiently within the channel, including engaging a first stop on the mount body with a first tab on the computer component in a first direction, and resiliently displacing a latch member past a second tab on the computer component when the component is slid in the first direction, and resiliently engaging the edge of the computer component and applying a biasing force to the edge in a direction outwardly of the channel to resiliently support the component while releasably latched by the stop mechanism.

24. The method of claim 23 wherein, the computer component includes a second edge and the sliding step is accomplished by sliding the second edge of the component along a channel formed in a second mount body that is secured to the computer housing in opposed relation to the first mount body, and resiliently engaging the second edge of the computer component and applying a biasing force to the second edge in a direction outwardly of the channel and opposed to the first biasing force to resiliently support the component between the first and second mount bodies while releasably latching the computer component by the stop mechanism.

* * * * *

UNITED STATES PATENT AND TRADEMARK OFFICE
CERTIFICATE OF CORRECTION

PATENT NO.   : 5,927,389
DATED        : July 27, 1999
INVENTOR(S)  : Daniel D. Gonsalves It is certified that error appears in the above-identified patent and that said Letters Patent is hereby corrected as shown below:

Title page, item [75], inventors: seventh inventor's name should be spelled as following:
Mathew Palazola Signed and Sealed this Thirteenth Day of June, 2000

Attest:

Q. TODD DICKINSON

*Attesting Officer*              *Director of Patents and Trademarks*